(12) United States Patent
Venkatadri

(10) Patent No.: US 10,074,624 B2
(45) Date of Patent: Sep. 11, 2018

(54) BOND PADS WITH DIFFERENTLY SIZED OPENINGS

(71) Applicant: ANALOG DEVICES, INC., Norwood, MA (US)

(72) Inventor: Vikram Venkatadri, Malden, MA (US)

(73) Assignee: Analog Devices, Inc., Norwood, IA (US)

( * ) Notice: Subject to any disclaimer, the term of this patent is extended or adjusted under 35 U.S.C. 154(b) by 0 days.

(21) Appl. No.: 14/821,228

(22) Filed: Aug. 7, 2015

(65) Prior Publication Data

US 2017/0040275 A1 Feb. 9, 2017

(51) Int. Cl.
*H01L 23/00* (2006.01)

(52) U.S. Cl.
CPC .............. *H01L 24/06* (2013.01); *H01L 24/03* (2013.01); *H01L 24/81* (2013.01); *H01L 2224/0603* (2013.01); *H01L 2224/0616* (2013.01); *H01L 2224/81203* (2013.01); *H01L 2924/351* (2013.01)

(58) Field of Classification Search
CPC ....... H01L 23/00; H01L 23/58; H01L 23/522; H01L 23/532; H01L 24/03; H01L 24/06; H01L 24/81; H01L 2924/351; H01L 2224/0603; H01L 2224/0616; H01L 2224/81203
USPC ........................................................ 257/773
See application file for complete search history.

(56) References Cited

U.S. PATENT DOCUMENTS

| | | | |
|---|---|---|---|
| 4,883,967 A | 11/1989 | Tsutsui et al. | |
| 5,874,776 A | 2/1999 | Kresge et al. | |
| 5,883,435 A * | 3/1999 | Geffken | H01L 23/525 |
| | | | 257/734 |
| 6,004,834 A | 12/1999 | Tsukude et al. | |
| 6,396,898 B1 | 5/2002 | Saito et al. | |
| 6,573,506 B2 | 6/2003 | Sato et al. | |
| 7,067,817 B2 | 6/2006 | Suganuma et al. | |
| 7,355,126 B2 | 4/2008 | Nishikawa et al. | |
| 7,358,501 B2 | 4/2008 | Danzer et al. | |
| 7,468,514 B1 | 12/2008 | Suzuki et al. | |
| 7,504,637 B2 | 3/2009 | Thorne | |
| 7,544,947 B2 | 6/2009 | Kerwin et al. | |
| 8,829,454 B2 | 9/2014 | Bolognia | |
| 2002/0011572 A1 | 1/2002 | Kajiwara et al. | |
| 2002/0034888 A1 | 3/2002 | Edwards et al. | |
| 2003/0010924 A1 | 1/2003 | El-Hanany et al. | |

(Continued)

FOREIGN PATENT DOCUMENTS

| | | |
|---|---|---|
| JP | 2002-022841 | 1/2002 |
| KR | 10-2013-0102943 | 9/2013 |

OTHER PUBLICATIONS

Cesmeli, Erdogan Ph.D., "V-Res—Detecting the Difference in Volume CT," GE Healthcare Publication.

(Continued)

*Primary Examiner* — Chuong A Luu
(74) *Attorney, Agent, or Firm* — Knobbe, Martens, Olson & Bear, LLP

(57) ABSTRACT

Integrated circuit dies are provide with a passivation layer having a plurality of differently sized openings exposing bond pads for bonding. The sizes of the bond pads vary in a manner that at least partially compensates for stresses during bonding, such as flip chip thermocompression bonding, due to asymmetric distribution of bond pads.

24 Claims, 11 Drawing Sheets

(56) References Cited

U.S. PATENT DOCUMENTS

| | | | |
|---|---|---|---|
| 2003/0036256 A1* | 2/2003 | Efland | H01L 24/03 |
| | | | 438/613 |
| 2003/0097875 A1 | 5/2003 | Lentz et al. | |
| 2003/0197289 A1* | 10/2003 | Lin | H01L 24/05 |
| | | | 257/786 |
| 2003/0227079 A1* | 12/2003 | Chia | H01L 23/3114 |
| | | | 257/723 |
| 2004/0223583 A1 | 11/2004 | Tsujii | |
| 2005/0029463 A1 | 2/2005 | Kaemmerer | |
| 2005/0067178 A1 | 3/2005 | Pearson et al. | |
| 2005/0104220 A1 | 5/2005 | Tsuchiya et al. | |
| 2005/0121804 A1* | 6/2005 | Kuo | H01L 22/32 |
| | | | 257/781 |
| 2005/0285973 A1 | 12/2005 | Singh et al. | |
| 2006/0223227 A1 | 10/2006 | Kubota et al. | |
| 2007/0164279 A1* | 7/2007 | Lin | H01L 22/32 |
| | | | 257/48 |
| 2007/0221859 A1 | 9/2007 | Nakata | |
| 2008/0011959 A1 | 1/2008 | Thorne | |
| 2008/0283764 A1 | 11/2008 | Kerwin | |
| 2009/0084971 A1 | 4/2009 | Ohta et al. | |
| 2009/0206486 A1* | 8/2009 | Lin | H01L 21/76801 |
| | | | 257/759 |
| 2010/0078565 A1 | 4/2010 | Tsubota et al. | |
| 2011/0133939 A1 | 6/2011 | Ranganathan et al. | |
| 2011/0272588 A1 | 11/2011 | Jadrich et al. | |
| 2012/0161330 A1 | 6/2012 | Hlad et al. | |
| 2012/0206160 A1* | 8/2012 | Wu | G01R 31/2884 |
| | | | 324/756.07 |
| 2013/0020579 A1 | 1/2013 | Nagami | |
| 2013/0147032 A1* | 6/2013 | Jeng | H01L 23/49838 |
| | | | 257/737 |
| 2013/0270329 A1 | 10/2013 | Schulte | |
| 2014/0159226 A1 | 6/2014 | Bolognia | |
| 2015/0061043 A1 | 3/2015 | Bolognia | |
| 2015/0364436 A1* | 12/2015 | Yu | H01L 24/11 |
| | | | 438/614 |

OTHER PUBLICATIONS

Maloney, Lawrence D., "Close Cooperation Among a Global Engineering Team Led to the Success of the Lightspeed VCT Medical Scanner," Test & Measurement World Aug. 2005.

International Search Report and Written Opinion of the International Search Authority in PCT/US2013/027643, dated Jun. 24, 2012, 12 pages.

Office Action dated Oct. 30, 2014 issued in U.S. Appl. No. 13/708,727, filed Dec. 7, 2012, 12 pages.

Office Action dated Aug. 6, 2013 in U.S. Appl. No. 13/405,594, filed Feb. 27, 2012.

Office Action dated Dec. 24. 2013 in U.S. Appl. No. 13/405,594, filed Feb. 27, 2012.

Extended Search Report dated May 26, 2015 in European Application No. 13755853.2 filed Aug. 4, 2014 in 6 pages.

Office Action dated Oct. 29, 2015 issued in U.S. Appl. No. 14/478,810, filed Sep. 5, 2014, 15 pages.

International Search Report and Written Opinion received in corresponding PCT Patent Application No. PCT/US2016/044070 dated Oct. 27, 2016 in 14 pages.

* cited by examiner

BOND PADS WITH DIFFERENTLY SIZED OPENINGS

BACKGROUND

Field

The present disclosure relates generally to electrically connecting an integrated circuit die with asymmetrically distributed bond pads.

Description of the Related Art

Semiconductor packaging includes forming electrical connections to bond pads in an integrated circuit (IC). Typically, bond pads are formed in metallization levels of the IC and covered with a passivation layer through which openings are formed to expose the bond pads to allow bonding for electrical connections to larger systems. The connections can be made, e.g., by wire bonding to bond pads facing away from a packaging substrate, or by flip-chip connection using bond pads face-down directly over contact pads of a packaging substrate, such as PCB. Wire bonding involves individual application of heat, pressure, and/or ultrasonic energy to each wire bond over its corresponding bond pad. Flip-chip bonding involves applying solder balls, gold bumps, copper pillars, or the equivalent conductive protrusion to the bond pads, inverting the IC over contact pads of a packaging substrate (e.g., PCB, ceramic, flexible, etc.), and thermocompression bonding with a platen (also known as a bond head) that applies pressure across the entire IC.

If the bond pads are asymmetrically distributed, the bonding process can create unbalanced stresses that can cause damage to the IC and/or alter the IC's electrical performance. Accordingly, a need exists for a methods and apparatus for avoiding such stress to the IC during bonding.

SUMMARY

In one aspect, an integrated circuit die comprising a plurality of bond pads is disclosed. The integrated circuit die can include a die passivation layer having a plurality of differently sized openings exposing a plurality of the bond pads. In another aspect, a packaged chip comprising a semiconductor die is disclosed. A packaging substrate can be electrically connected to the die. The die can include a die passivation layer having a plurality of differently sized openings.

In another aspect, a method of manufacturing an integrated circuit die is disclosed. The method can include providing a die having a plurality of bond pads. The method can include forming a passivation layer on the die. The method can include creating a plurality of differently sized openings in the passivation layer to expose a corresponding plurality of the bond pads.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Embodiments will now be described with reference to the following drawings, which are provided by way of example, and not limitation.

DETAILED DESCRIPTION

Embodiments disclosed herein describe systems, methods, and apparatus relating to forming electrical contact to integrated circuits having asymmetrical distributions of bond pads. Such asymmetry may arise in a variety of different contexts. For example, a mixed signal integrated circuit (IC) may benefit from arranging all analog input pins together on one side of the IC, and digital output pins distributed on two or more other sides, such that the analog side has a greater density of bond pads per unit area or length. The physical arrangement of contacts and traces on a packaging substrate may also constrain corresponding locations of bond pads on the IC to asymmetric patterns. In one example, an analog-to-digital converter (mixed signal processor IC) for a sensor module is physically positioned near an associated sensor die to reduce parasitic losses that may occur when the signal from the sensor die is transmitted to the processor die.

In embodiments described here, such asymmetrically distributed bond pads are exposed through passivation layer(s) by differently sized openings.

Figure 1:
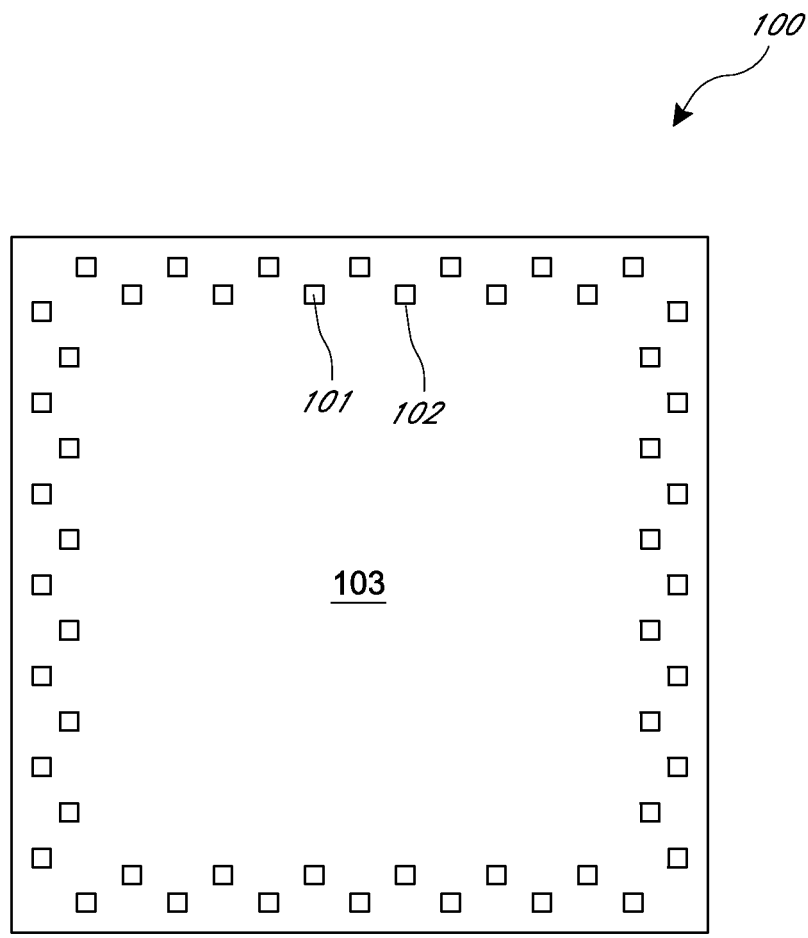
FIG. 1 is a schematic plan view of an integrated circuit with symmetrically distributed bond pads.
Figure 2:
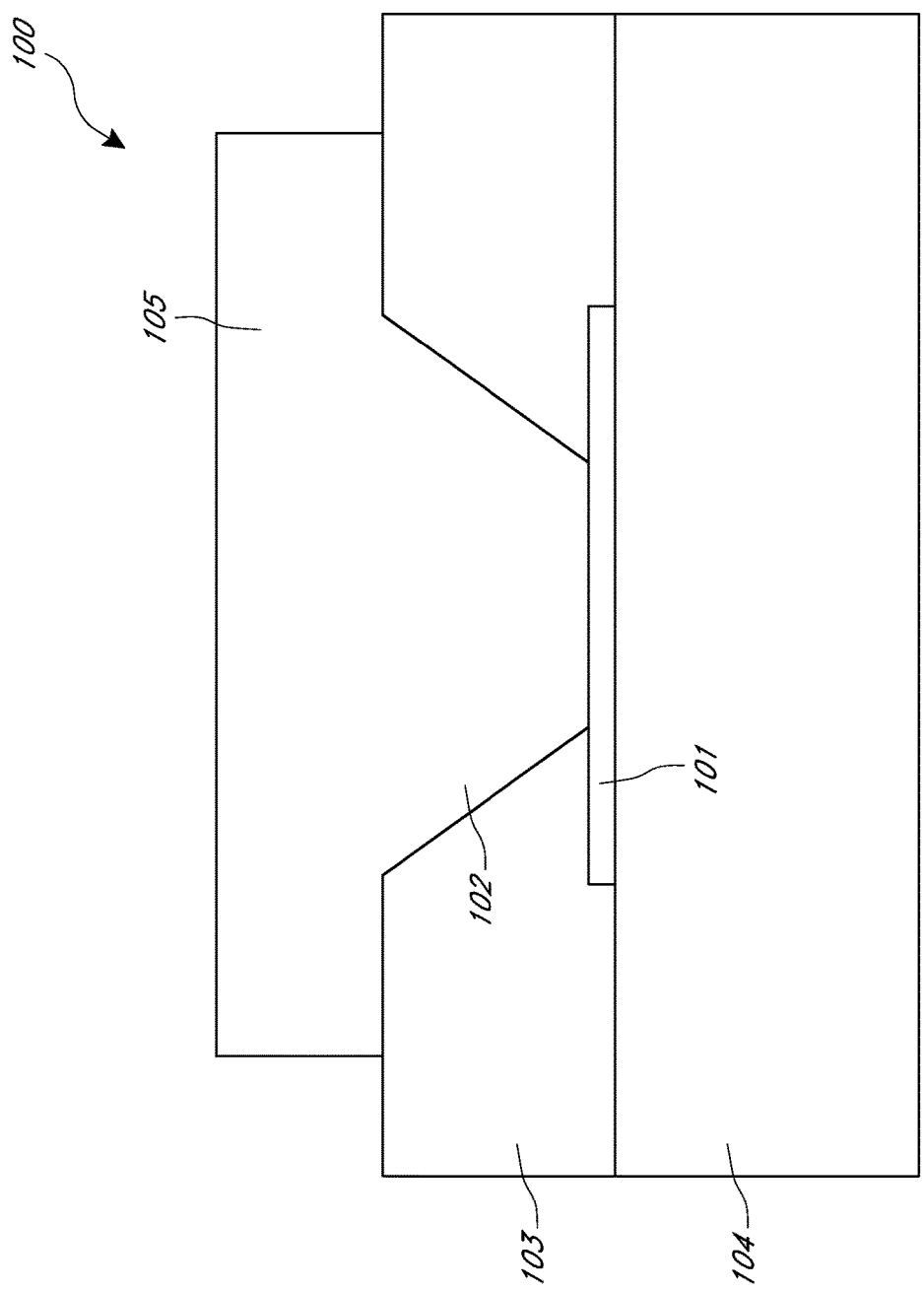
FIG. 2 is a schematic cross sectional view of a bond pad in the integrated circuit shown in FIG. 1.

The schematic plan view of FIG. 1 illustrates a non-limiting example of a conventional integrated circuit 100 comprising an exposed plurality of symmetrically distributed bond pads 101. Upper surfaces of the bond pads 101 are exposed though a corresponding plurality of openings 102 in one or more die passivation layer(s) 103. FIG. 2 illustrates a schematic cross sectional view of the integrated circuit 100 shown in FIG. 1. In particular, FIG. 2 shows an example opening 102 in a die passivation layer 103 exposing a portion of an upper surface of a bond pad 101. The die passivation layer, which can be any of a number of suitable dielectric materials, such as silicon oxide, silicon oxynitride, etc., is formed over the die material 104. FIG. 2 also shows a bump 105 formed in contact with the exposed upper surface of the bond pad. The bump can be, e.g., a solder ball, a gold bump, a copper pillar or other conductive protrusion. It will be understood that the substrate 104 can have a number of other patterned layers of metal, dielectric and semiconductor materials to form the circuitry of the integrated circuit 100.

Flip chip mounting integrated circuits, or dies, is well-known in the art. During flip chip attach of integrated circuit 100 shown in FIGS. 1-2, and during flip chip attach generally, a uniform load is applied by a platen during thermocompression bonding to the entire top surface of the die, which is transferred to an underlying packaging substrate (e.g., PCB, flexible substrate, lead frame, ceramic substrate, etc.) through a plurality of bumps (e.g., gold, copper pillars, solder balls, etc.) connected to bond pads. However, wherever a portion of the applied load is transferred to the substrate, there is reactionary force acting back on the bump and underlying bond pad. For this reason, dies with symmetrically distributed bond pads have conventionally been employed for flip chip mounting so that the uniformly applied load is spread evenly over the exposed bond pads during bonding.

Figure 3:
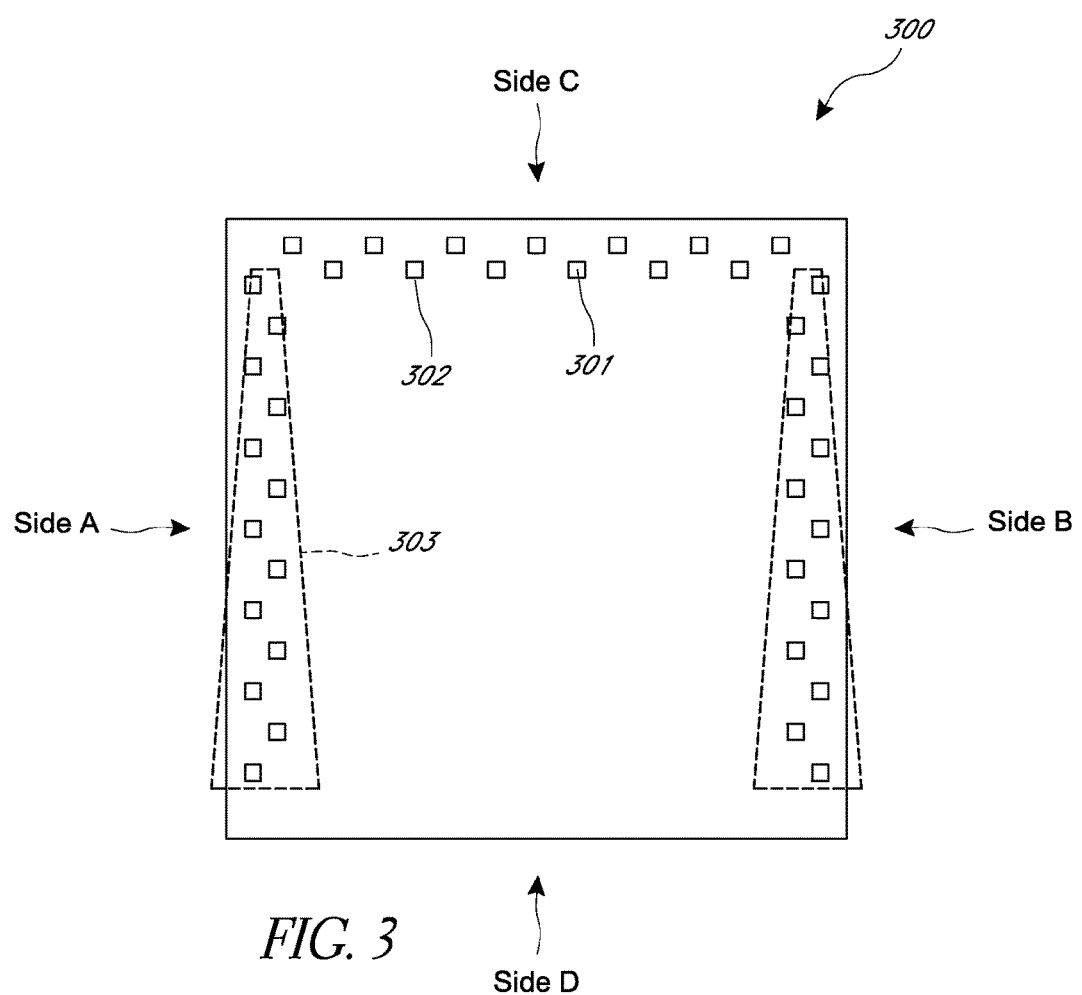
FIG. 3 is a schematic plan view of an integrated circuit with asymmetrically distributed bond pads.

FIG. 3 illustrates a schematic plan view of a die 300 comprising an exposed plurality of asymmetrically distributed bond pads 301 through a plurality of openings 302 in a passivation layer. Bond pads 301 are distributed on sides A, B, and C, but not on side D. As shown, the asymmetric bond pad distribution leads to the formation of a stress gradient 303 along sides A and B during flip chip bonding, with stresses largest near side D and least toward side C. The stresses on side C are uniform. The stresses on bond pads 301 may be greatest near locations on the die where the relative asymmetry between two or more regions causes pressure concentrations during bonding. For example, the stress on pads 301 nearest side D along sides A and B may be an order of magnitude greater than the stresses on pads 301 along sides A and B nearest side C. The absence of bumps on side D causes greater stresses at bond pads nearest side D because there are fewer bumps to spread out the applied load. As a result of stress gradient formation during bonding, bond pads may break or internal stresses may cause the integrated circuit to change electrical behavior or fail.

To alleviate the effects of asymmetric bond pad distribution during bonding, a plurality of differently sized openings may be formed through passivation layer(s) to expose the plurality of asymmetrically distributed bond pads. The differently sized openings serve to more evenly distribute the stresses generated during bonding by exposing different amounts of the upper surfaces of the bond pads. By exposing more or less of a bond pad, the contact region between the bump and the bond pad is increased or decreased, respectively. The openings may be larger near areas of high stress so that the applied load is distributed over a larger bond pad surface area and vice versa. Thus, the effects of asymmetric bond pad distribution may be alleviated, or compensated for, by exposing different amounts of bond pads in different regions. The underlying bond pads can be the same across the IC die, or differently sized bond pads may be used wherein openings in a die passivation layer match the bond pad size. Differently sized bond pads may be used, for example, where the die is designed for flip chip attachment with asymmetric bond pad distributions, in order to minimize metal that will not be exposed, which contribute to materials wastage and parasitic capacitance. However, the different opening sizes are also applicable to chips originally designed for wire bonding with uniform openings, whether the bond pads are uniformly or differently sized.

Figure 4A:
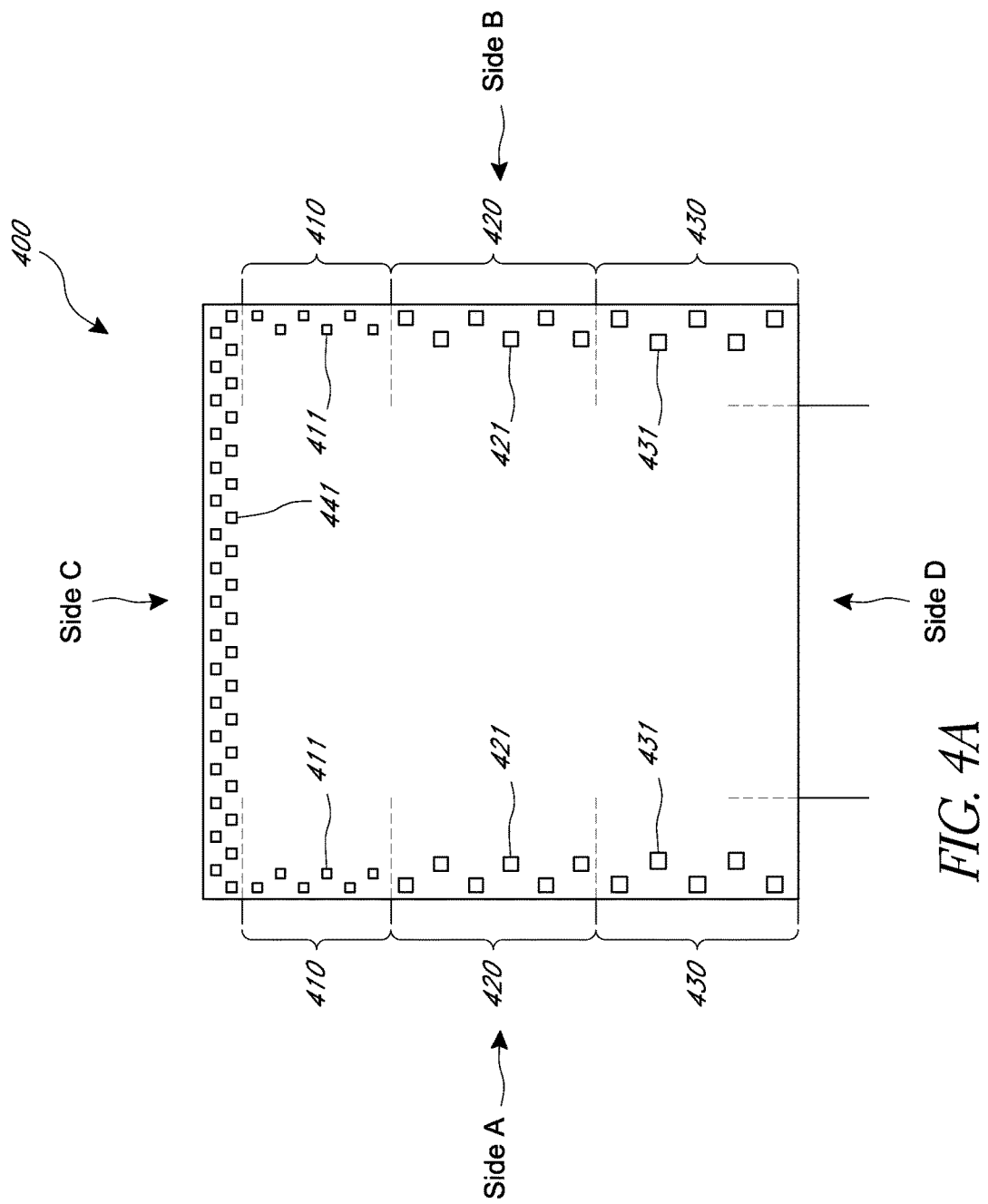
FIGS. 4A and 4B are schematic plan views of a die with a passivation layer having differently sized openings exposing asymmetrically distributed bond pads.

FIG. 4A illustrates a schematic plan view of a non-limiting example of a die 400 comprising a passivation layer having a plurality of differently sized openings exposing a plurality of asymmetrically distributed bond pads. One of ordinary skill in the art will readily appreciate that other suitable asymmetric bond pad distributions, or patterns, are also possible. As shown in FIG. 4A, die 400 may comprise sides A, B, C, and D such that bond pads are distributed on sides A, B, and C, but not on side D. For example, die 400 may be a 128 channel analog-to-digital converter die with 132 bond pads on side C (128 analog input channels and 4 ground connections), 66 bond pads on sides A and B (64 digital output channels and 2 ground connections), and 0 bond pads on side D. Other high density asymmetric bond pad distributions are also envisioned, as are other densities involving asymmetric distributions, such as low density distributions, in which the distribution of bond pads varies from one area of the die to another area of the die. Note that while the openings described herein are square, the skilled artisan will appreciate that any other suitable shape can be employed (e.g., circular, ovular, triangular, eccentric rectangle, etc.).

As further shown in FIG. 4A, the plurality of differently sized openings may comprise two or more different average opening sizes, such as, for example, openings 411, 421, and 431 along sides A and B, and openings 441 on side C. In one embodiment, openings 441 have the smallest size and openings 431 have the largest, with openings 421 and 431 having sizes falling sequentially somewhere in between. For example, in one embodiment, openings 441, 411, 421, and 431 may have generally square openings comprising average opening sizes of approximately 625 $\mu m^2$ (25×25 $\mu m$), 729 $\mu m^2$ (27×27 $\mu m$), 1,225 $\mu m^2$ (35×35 $\mu m$), and 1,764 $\mu m^2$ (42×42 $\mu m$), respectively. Openings 441 nominally differ from openings 431 in maximum lateral dimensions by 17 $\mu m$ (68%), or in area by 1139 $\mu m^2$ (182%). Openings 441 nominally differ from openings 411 in maximum lateral dimensions by 2 $\mu m$ (8%), or in area by 104 $\mu m^2$ (17%). The various openings 441, 411, 421, and 431 may range in surface area of the bond pad exposed from approximately 500-690 $\mu m^2$, 700-900 $\mu m^2$, 1000-1400 $\mu m^2$, and 1600-2000 $\mu m^2$, respectively. Each type of opening may be identified by its average size or its nominal size falling into the ranges above (or other ranges). In the examples above, the lateral dimensions and areas are measured at the top of the openings, at the upper surface of the passivation layer.

More generally, the size differences between the maximum lateral dimensions of the smallest openings (e.g., openings 441) and the largest openings (e.g., openings 431) is greater than any difference in size that results from manufacturing tolerances. For example, in one embodiment, the size differences between the maximum nominal lateral dimensions of the smallest openings (e.g., openings 441) and the maximum nominal lateral dimensions of the largest openings (e.g., openings 431) may be, for example, between about 2 $\mu m$ and 100 $\mu m$. In certain embodiments, the percentage difference between the nominal maximum lateral dimensions of the smallest and largest openings, relative to the size of the smallest, may be between about 5% and 500%, between 10% and 200%, or between any other suitable nominal percentage differences. Nominal surface area of the openings can differ between the smallest and the largest openings by between about 200 $\mu m^2$ and 2000 $\mu m^2$, between 500 µm² and 1500 µM², between 10% and 500%, or between 15% and 200%. The skilled artisan will appreciate that the ranges are nonlimiting examples of size differences to reduce stresses from asymmetric distribution of bond pads, and that other ranges are possible. In particular, smaller differences can be useful for grading the opening sizes from smallest to largest in a direction corresponding to the direction of densest to least dense concentration of bond pad openings. As used herein, average size openings between groups of openings are not considered "different" if the differences fall within the manufacturing tolerances. "Nominal" size openings refer to the designed opening sizes as defined by the manufacturing process, and so need not account for any manufacturing tolerances. The skilled artisan will appreciate that manufacturing tolerances may differ for different patterning technologies.

The plurality of differently sized openings may be further arranged into groups, or zones, such that openings with the same average opening size are in the same group. For example, in FIG. 4A, openings 441 are grouped in one zone on side C, and openings 411, 421, and 431 are grouped on sides A and B into zones 410, 420, and 430, respectively. Other zones are also envisioned, such as, for example, two zones along sides A and B, or four zones along sides A and B and two zones on side C, each zone having its own average opening size that is different from those of the other zones.

Figure 4B:
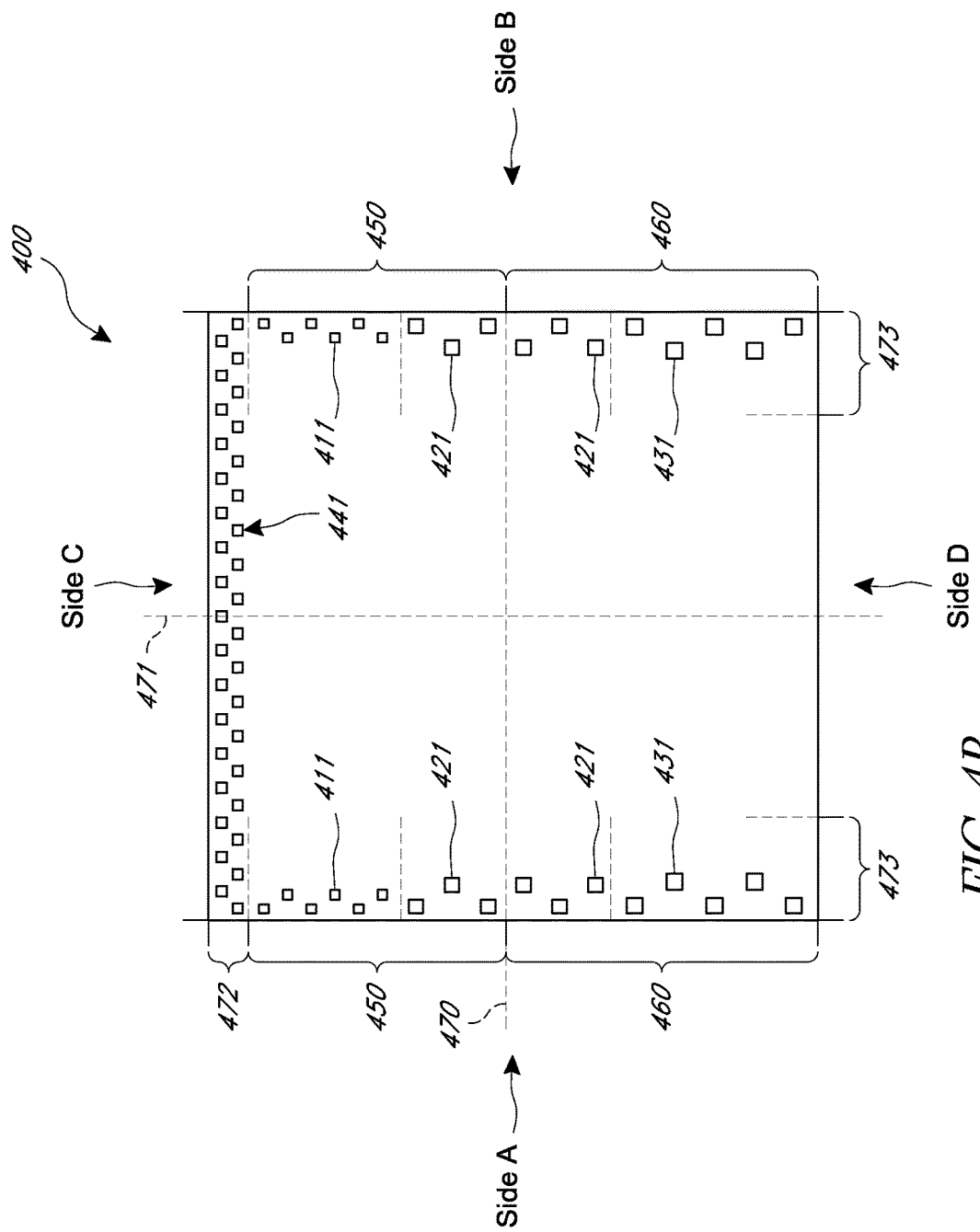

Note that the zones can be defined arbitrarily and the calculated average opening size for each zone can include multiple differently sized openings in the same zone. For example, FIG. 4B illustrates the die of FIG. 4A separated into two zones, a first zone 450 on a first half of the die and a second zone 460 on a second half of the die, divided at horizontal centerline 470. Thus, as shown in FIG. 4B, the first zone 450 may comprise all of side C and the upper half of sides A and B, and the second zone 460 may comprise all of side D and the lower half of sides A and B. In FIG. 4B, the first zone 450 includes three differently sized openings, including openings 411 and 421 along each of sides A and B and openings 441 on side C. The second zone 460 includes two differently sized openings, openings 421 and 431 along sides A and B. The total average opening size in the first zone 450, which can be referred to as a first average opening size, may be different from the total average opening size in the second zone 460, which can be referred to as a second average opening size. For example, in the illustrated embodiment, with the sizes as described with respect to FIG. 4A, the first average opening size in the first zone 450 is less than the second average opening size in the second zone 460 when the first zone has more bond pads relative to the second zone. It will be understood that the total bond pad surface area exposed in the first zone may be closer to the total bond pad surface area exposed in the second zone, compared to the use of uniform openings in the passivation layer(s) for the same asymmetric bond pad distribution.

In one embodiment, the first zone may have more bond pads relative to the second zone based partly on asymmetric bond pad distribution. In general, the plurality of opening sizes may be larger in zones of lower bond pad density. In one embodiment, asymmetry may be determined by comparing the number of bond pads on two adjacent halves of the die. In another embodiment, asymmetry may be determined by comparing the number of bond pads on adjacent quadrants of the die. In general, it will be understood that asymmetry may be determined by comparing the number of bond pads on any two or more adjacent and/or non-adjacent arbitrarily defined regions on the die. When the numbers of bond pads are different between two adjacent regions or zones of similar surface area, an asymmetry exists and larger average opening sizes may be associated with the area of the die that has fewer bond pads to compensate for asymmetric stresses that thermocompression would apply to asymmetric numbers of bond pads with uniform openings. For example, in FIGS. 4A and 4B, larger opening sizes are associated with the lower half of the die (encompassing side D) relative to upper half (encompassing side C) because there are fewer bond pads on the lower half of the die.

As further shown in FIG. 4B, in one embodiment, sides A and B vertically extend from the bottom extent of side C to the top extent of side D and horizontally extend some distance inward toward vertical centerline 471, where vertical and horizontal are from the perspective of the page. Side C may extend inward a distance 472 from the top edge of the die, and sides A and B may extend inward a distance 473 from the left and right edges of the die, respectively. In one embodiment, distance 473 may be a constant along sides A and B. In other embodiments, different zones on the die may extend different distances 473 inward toward vertical centerline 471. Side D may extend some distance inward toward the horizontal centerline 470 such that it is between the areas having bond pads on sides A and B. In embodiments in which side D has bond pads, side D may extend inward from the bottom edge of the die toward horizontal centerline 470.

Moreover, although not shown in FIGS. 4A and 4B, adjacent zones may have a transition area where the opening size incrementally changes from one size to the next. The transition area may comprise one or more differently sized openings. In still other embodiments, instead of zones, the size of the plurality of differently sized openings may change gradually across the die from one opening to the next, or from every two or more openings to the next two or more openings. Whether the plurality of differently sized openings are dynamically varied across the die and/or discreetly varied in groups of constant size, in one embodiment, relatively larger opening sizes are positioned nearest the side of the die with the smallest density or no bond pads. For example, in FIGS. 4A and 4B, the plurality of openings with the largest opening size may be positioned nearest side D, such as, for example, in zone 430 (FIG. A) or zone 460 (FIG. B). In still other embodiments, both density of bond pads and size of openings can be asymmetrically distributed in two dimensions. While the illustrated example of FIGS. 4A and 4B shows asymmetry about a horizontal axis (e.g., horizontal centerline 470) and symmetry about the vertical centerline 471, it will be understood that the bond pad densities and compensating opening sizes need not follow the illustrated pattern.

Figure 5:
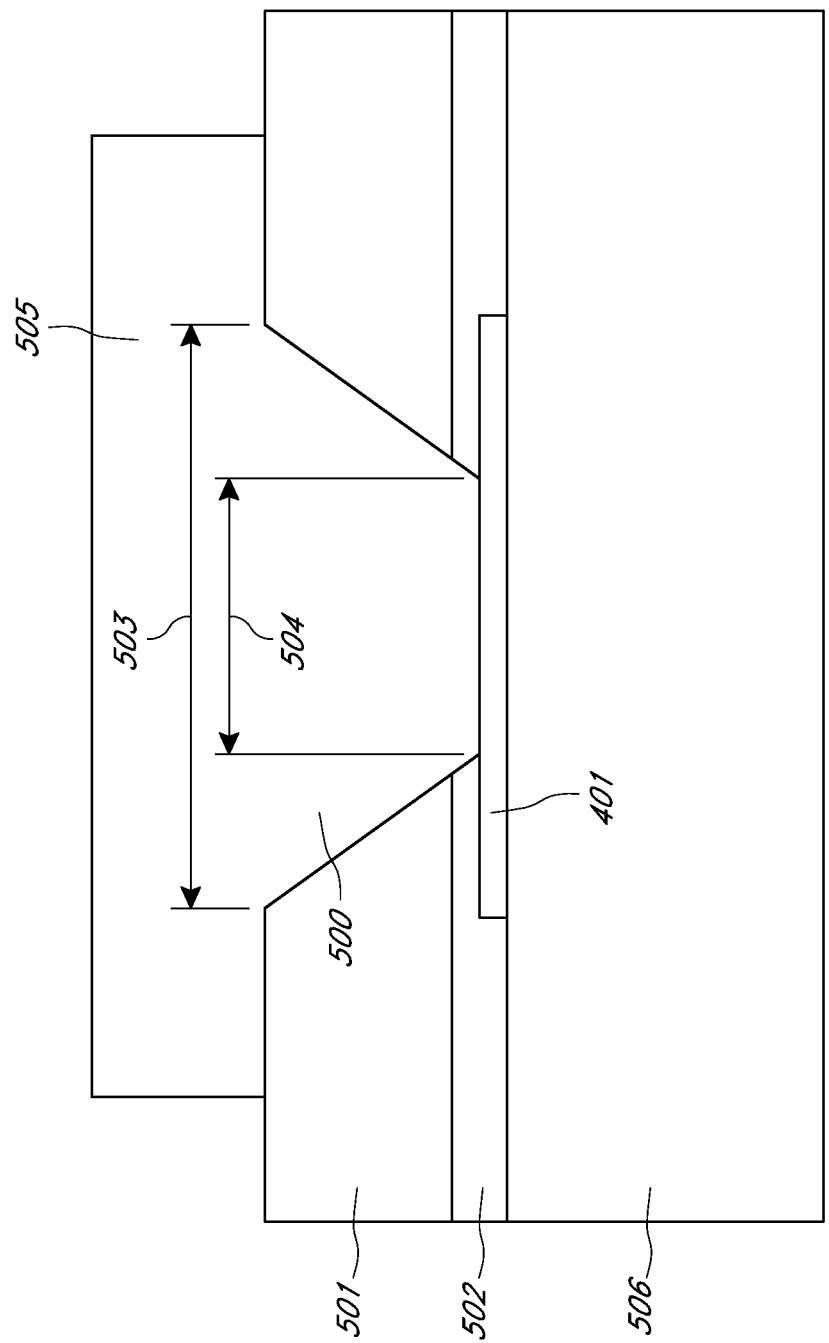
FIG. 5 is a schematic cross section of a die with differently sized openings, such as the die shown in FIG. 4, including a compressible layer to facilitate thermocompression bonding.
Figure 6:
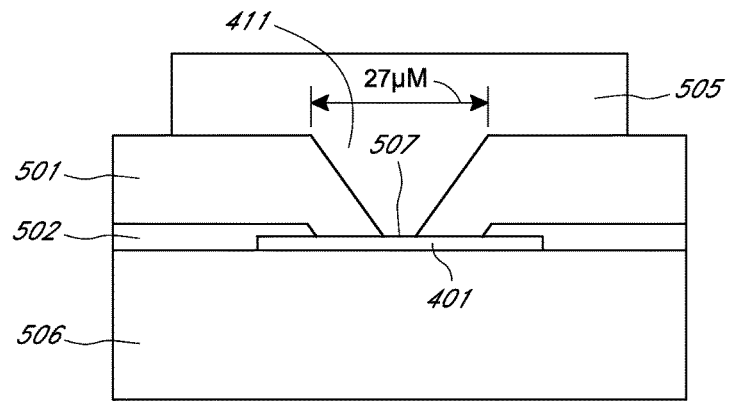
FIG. 6 is a schematic cross section of a bond pad from one group in FIG. 4, exposed by an opening of a first size.
Figure 7:
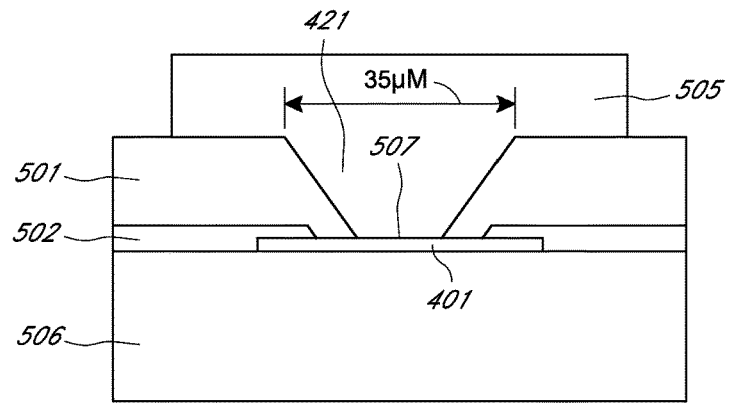
FIG. 7 is a schematic cross section of a bond bad from another group in FIG. 4, exposed by an opening of a second size.
Figure 8:
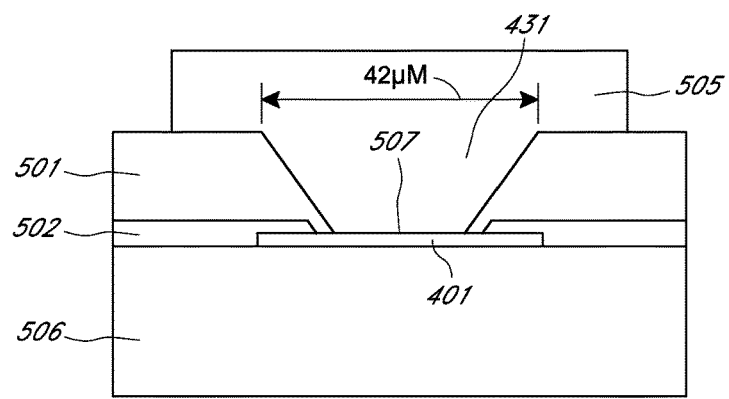
FIG. 8 is a schematic cross section of a bond pad from a third group in FIG. 4, exposed by an opening of a third size.
Figure 9:
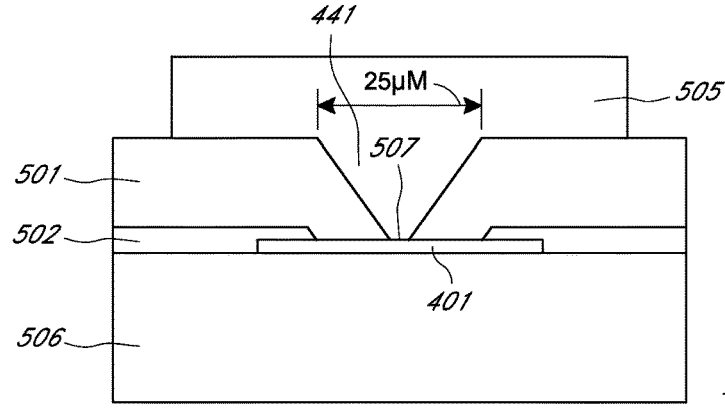
FIG. 9 is a schematic cross section of a bond pad from a third group in FIG. 4, exposed by an opening of a fourth size.

FIG. 5 illustrates a schematic cross section of a general bond pad 401 formed over a silicon layer 506. FIGS. 6-9 depict cross sections of different bond pads of die 400 shown in FIGS. 4A and 4B.

Referring to FIG. 5, an opening 500 through one or more die passivation layers is shown. The opening 500 is formed through at least a dielectric passivation layer, and particularly through a polymer or other compliant material, such as a polyimide layer 501 in the illustrated embodiment. As shown, the opening 500 may be formed through multiple dielectric layers, in the illustrated embodiment including a polyimide layer 501 and an inorganic passivation layer 502, such as silicon oxide, silicon nitride or silicon oxynitride. When viewed from above, the opening 500 may take the general form of a square, circle, oval, eccentric rectangle, triangle, or any other suitable shape.

Further, the opening 500 may comprise a top opening size 503 different from a bottom opening size 504 as a result of differential wet-etching exposure times during the fabrication of opening 500. For example, the size differential between top opening size 503 and bottom opening size 504 may be in the range of 2-15 µm. The slope of the opening may range from between 30° and 90° (vertical) to the upper surface. The amount of the upper surface of bond pad 401 that is exposed by the opening 500 may correspond to the area of bottom opening size 504.

As described above, the opening 500 shown in FIG. 5 may be varied for different bond pads across the die. Thus, the die 400 shown in FIGS. 4A and 4B comprises a plurality of differently sized openings 411, 421, 431, 441. As illustrated in FIG. 5, a bump 505 may be formed in the opening 500 and make contact with an exposed upper surface of bond pad 401. The bump 505 may include multiple materials or layers. Advantageously, the size of the opening 500 may be varied across the die so that stress gradients formed during bonding are alleviated. For example, larger openings 500 may be created in areas of smaller bond pad density so that the larger reactionary forces exerted by bumps 505 against bond pads 401 in areas of smaller bond pad density have a larger surface area over which to dissipate. In other words, the opening sizes may be varied so the load that is applied during bonding can distribute over a greater area and therefore alleviate the stress gradient that would otherwise form using uniformly sized openings with an asymmetric bond pad distribution across the die.

FIGS. 6-9 illustrate schematic cross sections of the die 400 in which openings 411, 421, 431, and 441 are advantageously sized to alleviate the formation of stress gradients during bonding, and particularly during thermocompression flip-chip bonding, of the die 400 as a result of the asymmetric distribution of bond pads. In one embodiment, each bump 505 in FIGS. 6-9 has the same average size, such as, for example, 50 µm×50 µm. In one embodiment, the differently sized openings 411, 421, 431, and 441 may correspond to generally square openings having an average area of about 27×27, 35×35, 42×42, and 25×25 µm², measured at the top of each opening. When measured at the bottom of each opening, assuming a differential of about 10 µm, the differently sized openings 411, 421, 431, and 441 in one embodiment have an average of 17×17, 25×25, 32×32, and 15×15 µm². Whether the opening sizes are measured at the top or the bottom, the larger openings are positioned in areas of greater stress so that the load applied during bonding may be distributed over a larger surface area. In other embodiments, openings 411, 421, 431, and 441 may range in size, for example, from approximately 500-900 µm², 1000-1400 µm², 1600-2000 µm², and 500-900 µm², respectively, when measured from the top of each opening, which corresponds to the mask opening used to pattern the bond pads. Exposed bond pad surfaces 507 for openings 411, 421, 431, and 441, which correspond to the opening sizes as measured at the bottom of each opening, may range in size from approximately 250-400 µm², 500-800 µm², 900-1200 µm², and 50-240 µm², respectively, for the illustrated embodiment. Of course, the skilled artisan will appreciate that these numbers will change for different degrees of opening slopes, and can be scaled for bigger or smaller overall opening sizes.

FIGS. 6-9 also show that, where multiple dielectric passivation layers are employed, the opening sizes through the lower inorganic passivation layer and the upper polymer passivation layer can be aligned but need not be the same size. For example, the openings through the lower inorganic passivation layer 502 can be uniform across the die, and formed at the wafer level prior to dicing. The openings through the polyimide layer 501 can be differently sized in different zones across the die, and can be formed either at the wafer level or after dicing, preferably at the wafer level. In the illustrated embodiment, the openings through the inorganic passivation layer 502 are uniform and slightly larger than the largest openings 431. In other embodiments, the openings through an overlying polymer layer and underlying inorganic layer can be coincident.

As discussed above, the plurality of differently sized openings may be formed through a polyimide layer. Polyimide is a compliant material often employed in semiconductor manufacturing and packaging and can serve as a stress buffer that further serves to alleviate the effects of die asymmetry. It does so by absorbing some of the pressure applied to the bumps during flip chip attach. Although polyimide has been referenced, the use of any other suitable passivation layer material is also envisioned, such as, for example, polybenzoxazole (PBO).

Referring back to FIG. 5, bond pads 401 may have an average thickness ranging from approximately 0.2 to 3.5 µm and the thickness of the polyimide layer 501 may range from approximately 2.0 to 20.0 µm. The average opening sizes across the die may range from approximately 100 µm² to 2,500 µm², among any other suitable range, as measured at the top of the openings. For example, returning to FIGS. 4A and 4B, openings 411, 421, 431, and 441 may correspond to generally square (or any other suitable shape) openings having average surface areas of about 729 µm², 1225 µm², 1764 µm², and 625 µm², as measured at the top of the openings.

Figure 10:
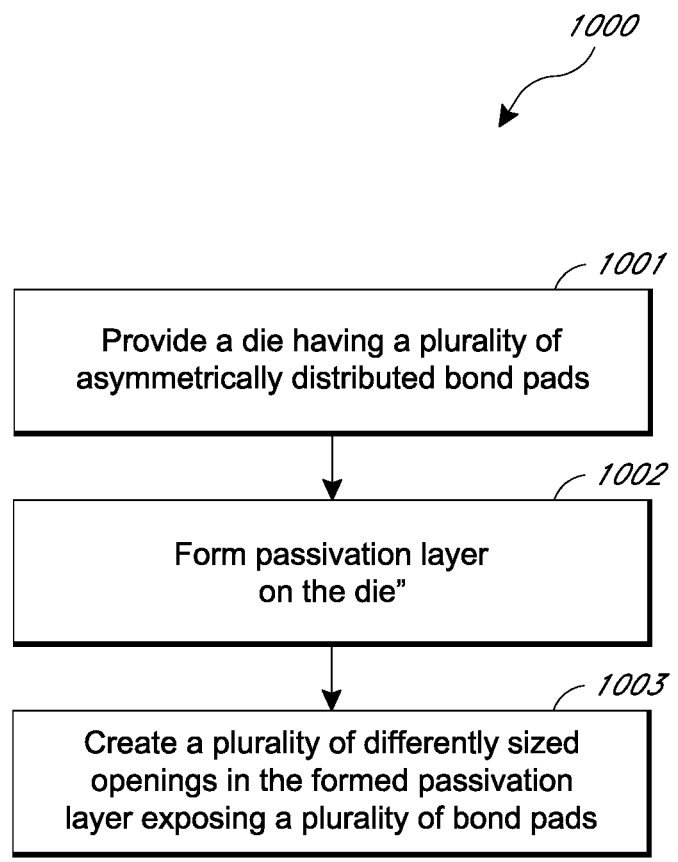
FIG. 10 is a flow diagram illustrating a method of making an integrated circuit die with a plurality of differently sized bond pad openings according to one embodiment.

Turning now to FIG. 10, a flow diagram illustrates a method of manufacturing a die comprised of a plurality of differently sized openings exposing a plurality of bond pads according to one embodiment. Process 1000 begins with block 1001. At block 1001, a die is provided that includes a plurality of bond pads. In one embodiment, the plurality of bond pads are asymmetrically distributed across the die. Process 1000 continues with block 1002, in which a passivation layer is formed on the die. As discussed above, this layer may include a compliant material, such as polyimide or another suitable material such as PBO. The passivation layer may also or instead include an inorganic dielectric, such as silicon oxide or silicon oxynitride. Process 1000 continues with block 1003, in which differently sized openings are created in the deposited passivation layer to expose different surface areas of the bond pads in block 1002. In one embodiment, the plurality of differently sized openings comprises a plurality of groups of openings having different average opening sizes. The distribution of the differently sized openings is based partly on how the bond pads are asymmetrically distributed. As discussed above, larger opening sizes are associated with zones or groups having fewer bond pads (or lower bond pad density) relative to zones or groups having a more bond pads (or higher bond pad density). The method may continue in bonding (e.g., thermocompression bonding for flip chip attachment) the bonding pads of the die to contacts or leads of a packaging substrate, such as a PCB substrate, a flexible substrate or "flex" as it is known in the industry, lead frame or ceramic substrate. The packaging substrate is thus electrically and mechanically connected to the die.

The above-described structures and processes are applicable to any die in which bond pads are asymmetrically distributed, or dies that have symmetrically distributed bond pads but only a subset asymmetrical pattern is to be contacted. The die need not be redesigned other than tailoring the opening sizes as described, which can be performed at the wafer or die level. Alternatively, as noted above, the die can be designed to have a plurality of differently sized bond pads for corresponding differently sized openings. In this way, the plurality of openings will expose a greater percentage of the upper surfaces of the plurality of differently sized bond pads, less metal is wasted and parasitic capacitance can be reduced.

The plurality of differently sized openings exposing a plurality of bond pads through a die passivation layer described in the above embodiments may alleviate the formation of stress gradients during bonding of a die having asymmetrically distributed bond pads by spreading out the load applied during bonding over a greater bond pad surface area in die areas with lower bond pad density that would otherwise be subject to disproportionate stresses. By creating a plurality of differently sized openings in a die passivation layer, dies with asymmetrical bond pad distributions that were originally designed for wire bonding need not go through expensive redesign to be flip chip compatible. Alternatively, newly designed integrated circuits can employ smaller die pads in regions of higher bond pad density in a way that can reduce cross-talk, noise, leakage, etc.

Figure 11:
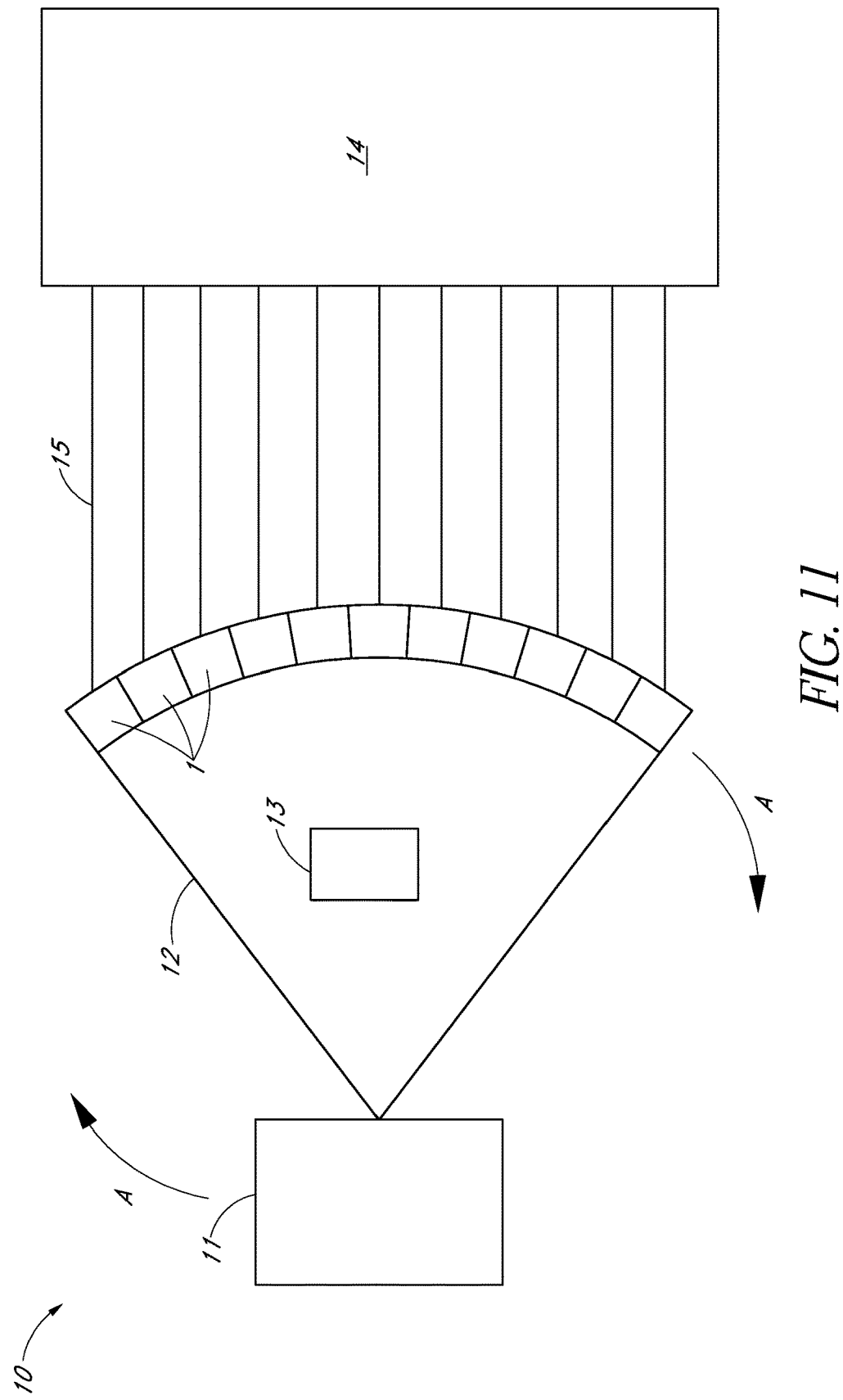
FIG. 11 is a schematic plan view of an imaging system incorporating processor die(s) with asymmetrically distributed bond pads, according to one embodiment.
Figure 12:
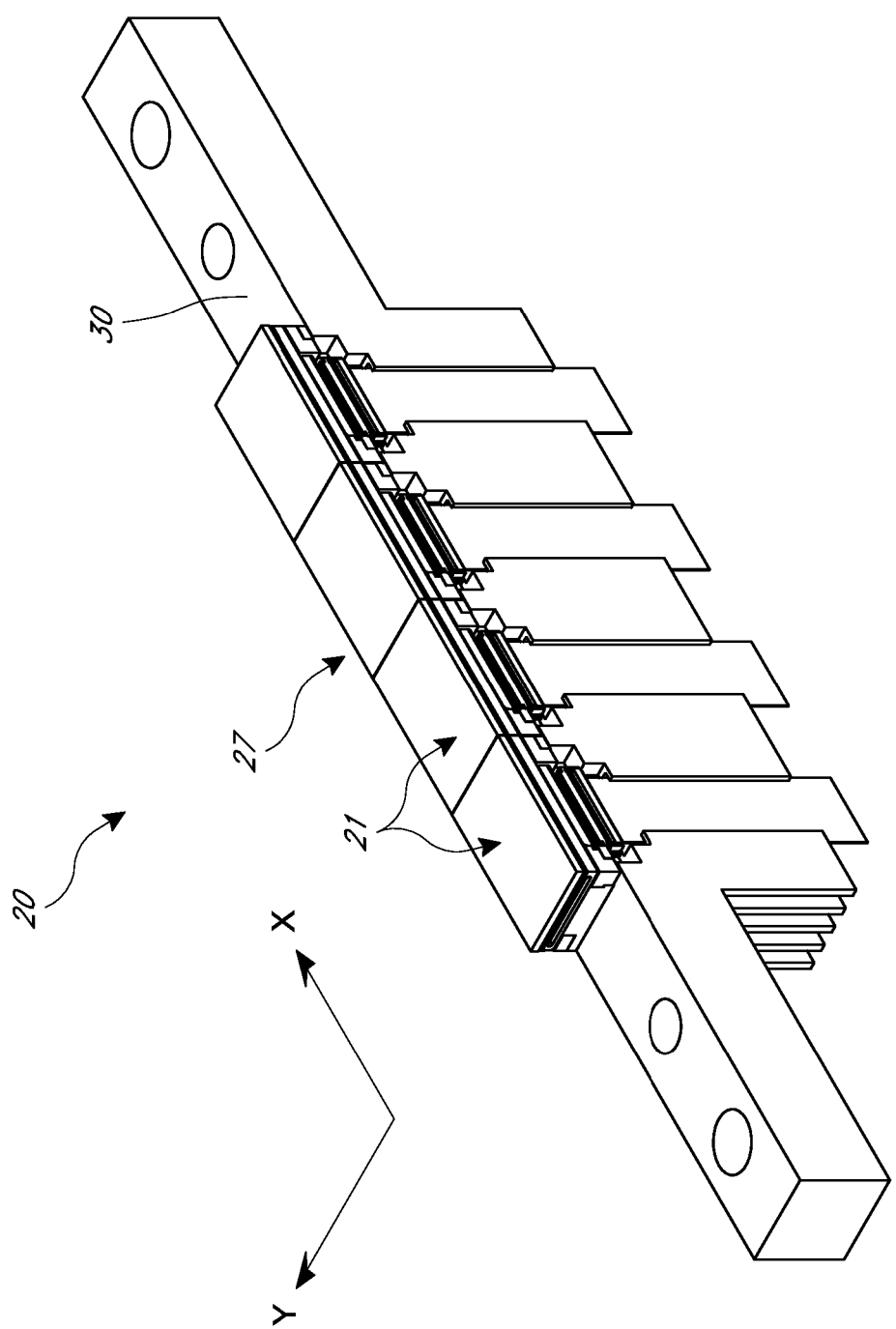
FIG. 12 is a three-dimensional schematic perspective view of a portion of an array of sensor modules, in accordance with an embodiment.
Figure 13:
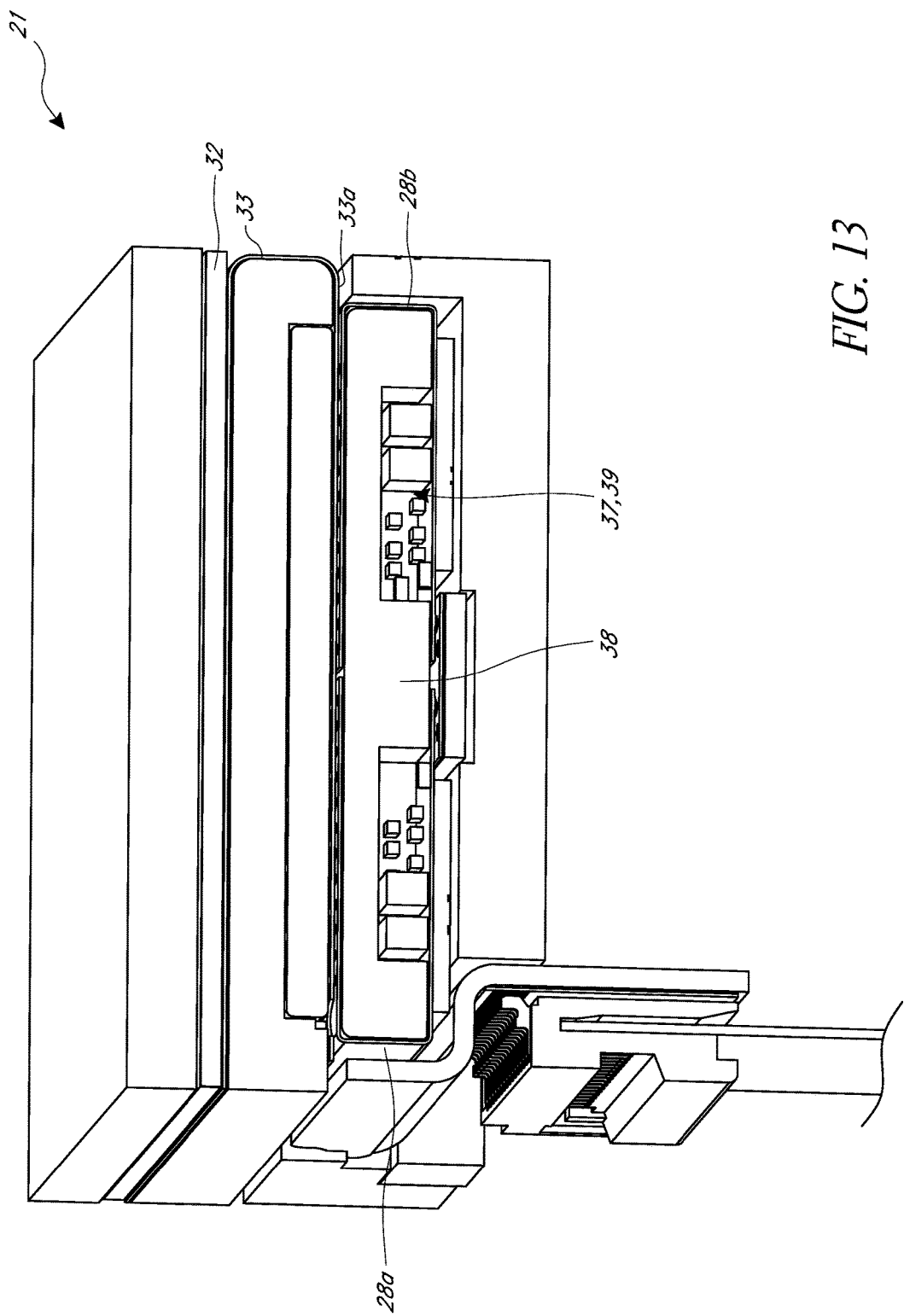
FIG. 13 is a schematic perspective cut-away view of one of the sensor modules shown in the sensor module array depicted in FIG. 12, according to one embodiment.

FIGS. 11-13 illustrate an example of a module, or package, in which dies with asymmetrical bond pad patterns and flip chip mounting are useful. FIGS. 11-13 illustrate compact sensor modules that position a sensor close to the processing electronics. In particular, processor dies, such as analog-to-digital converters (ADCs) with asymmetrically distributed bond pads may be flip chip mounted to processor substrates in electrical communication with sensor dies. The structures and methods described above can be employed to alleviate stresses during the bonding operation.

FIG. 11 illustrates an imaging system 10 according to one embodiment in which imaging system 10 includes a plurality of compact sensor modules having processor dies with asymmetrically distributed bond pads. In some implementations, the imaging system 10 can be a computed tomography (CT) device. CT devices are useful in a variety of fields, including medical imaging, industrial imaging, non-destructive testing, and subsurface imaging. In the imaging system 10 of FIG. 11, a source 11 can emit radiation 12 in the direction of an object 13 to be imaged (e.g., a patient). In one embodiment, the source 11 emits x-ray radiation. Skilled artisans will understand that there are various conventional mechanisms to emit radiation for imaging purposes. After some portion of the radiation 12 passes through the object 13, it reaches a one-dimensional (1D) or two-dimensional (2D) array of sensor modules 1 positioned opposite the source 11. The sensor modules 1 can be configured to convert detected radiation (e.g., visible light) to electrical signals using a photodiode array (PDA), which can be the sensor of this imaging example. In some implementations, the sensor modules 1 may also be configured to convert detected x-ray radiation to visible light, or the system 10 can include a separate scintillator for that purpose. In other implementations, detected x-ray radiation may be converted to electrical signals in other ways. The sensor modules 1 are also configured to convert the analog signals received from the PDA into digital signals that can be transmitted by transmission elements 15 to an external control module 14. The sensor modules 1 can also perform various other preprocessing and/or preconditioning operations on the detected signals before transmission to the control module 14. After the processed digital signals are received by the control module 14, the control module 14 can further process the digital signals into a readable output, such as an image on a display device or a report of various measured values calculated from the received signals. To obtain a full 3D image of the object 13, the system 10 can rotate around the object 13 in the direction A shown in FIG. 11 to obtain images of the object 13 at various angles.

In other embodiments, the imaging system can employ ultrasound or nuclear imaging technologies, such as PET scans and gamma ray imaging technologies. In yet other embodiments, the sensor modules can be used in various non-imaging arrangements, e.g., electrical, electronic, or optical applications that employ a compact module that includes both a sensor and a processor. For example, microelectromechanical systems (MEMS) devices, such as MEMS microphones and accelerometers, may include both a sensor die and a processor die near the sensor in order to process signals from the sensor. In these embodiments, sensor modules similar to those illustrated herein may be useful in providing a compact sensor package, while electromagnetically shielding and/or thermally insulating the sensor from the processor.

FIG. 12 is an exemplary three-dimensional schematic perspective view of a portion of an array of sensor modules 21. As shown in FIG. 12, each sensor module 21 can be mounted on a bracket 30 that is part of a larger imaging system 20. The imaging system 20 may be the same as or similar to the imaging system 10 described above with respect to FIG. 11. For example, the imaging system may comprise a CT device, an X-ray device, an ultrasound device, etc. In the example of FIG. 12, four sensor modules 21 are positioned in a string 27 that extends along a longitudinal X-axis, however, it should be appreciated that greater or fewer than four modules 21 can be positioned in the string 27 adjacent one another along the X-axis. Although not illustrated in FIG. 12, the array of modules 21 can comprise multiple strings 27 adjacent one another along a direction which is transverse to the X-axis. In some embodiments, the strings 27 can be positioned along a curved surface, each string 27 representing one of the modules 1 of FIG. 11. As shown in FIG. 12, for example, the Y-axis of the illustrated string 27 can be tangent to the curved surface along which the array of modules 21 is positioned. In various arrangements, a patient can be positioned inside the curved surface of the array, and the system 20 can image portions of the patient's body.

FIG. 13 is a schematic perspective cut-away view of the sensor module 21 shown in FIG. 13. In particular, a first processor substrate 28a and a second processor substrate 28b can each be formed of a flexible packaging substrate, and may be wrapped about opposing sides of a carrier 38. The processor substrates 28a, 28b may be wrapped about axes that are generally parallel to the axis about which a sensor substrate 33 is wrapped. One or more processor dies 39 and passive electronic components 37 can be mounted on and electrically coupled to the flexible processor substrates 28a, 28b. The processor dies 39 can conduct various processing operations on the signals transmitted from sensor dies 32, e.g., converting the analog signals to digital signals.

To provide electrical communication between the sensor dies 32 and the processor dies 39, the bottom segment 33a of the sensor substrate 33 can electrically connect to the processor substrates 28a, 28b. The electrical bonds between the processor substrates 28a, 28b and the processor dies 39 can complete the electrical pathway between the sensor dies 32 and the processor dies 39. In various implementations, the sensor substrate 33 can be soldered to processor substrates 28a, 28b. In other embodiments, the sensor substrate 33 can be electrically coupled to the processor substrates 28a, 28b using ACF or NCP technologies. As with the sensor dies 32, the processor dies 39 may be electrically coupled to the processor substrates 28a, 28b using a gold thermocompression bond with copper leads; in other arrangements, solder may be used, or ACF or NCP techniques may be used.

In order to accommodate dozens of analog inputs and digital outputs (e.g., 128 of each), the processor dies are provided with an asymmetric distribution of bond pads, as described with respect to FIGS. 4A and 4B. Accordingly, the processor dies 39 may be provided with differently sized openings to expose their bond pads and flip chip mounted to the substrates 28a, 28b, as described above with respect to FIGS. 4A-10 above.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow. Moreover, language such as "up to," "at least," "greater than," "less than," "between," and the like includes the number recited. Numbers preceded by a term such as "approximately", "about", and "substantially" as used herein include the recited numbers (e.g., about 10%=10%), and also represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

I claim:

1. An integrated circuit die comprising:
a plurality of bond pads; and
a die passivation layer comprising polymer and having a plurality of differently sized openings exposing a plurality of the bond pads, positions of the differently sized openings distributed asymmetrically relative to an entire upper surface of the integrated circuit die in a top down view, wherein sizes of the differently sized openings are measured horizontally at an upper surface of the die passivation layer.

2. The integrated circuit die of claim 1, wherein the plurality of differently sized openings comprises two or more groups of openings, each group having a different average opening size relative to the other group(s).

3. The integrated circuit die of claim 2, wherein a size difference between average maximum lateral dimensions for two of the groups is greater than about 2 μm.

4. The integrated circuit die of claim 2, wherein the groups of openings correspond to two areal zones of the upper surface of the integrated circuit die in the top down view, including a first zone comprising a first half of the die and a second zone comprising a second half of the die, wherein the first and second zones have different average opening sizes.

5. The integrated circuit die of claim 4, wherein the openings of the first zone have a first average opening size and the openings of the second zone have a second average opening size, wherein the first average opening size is smaller than the second average opening size, and wherein the first zone has a higher number of exposed bond pads compared to the second zone.

6. The integrated circuit die of claim 5, the upper surface of the integrated circuit die having a first side, a second side opposite the first side, a third side, and a fourth side opposite the third side, wherein the first zone includes the third side and the second zone includes the fourth side, wherein the third side has a higher number of exposed bond pads compared to the fourth side.

7. The integrated circuit die of claim 1, wherein sizes of the plurality of the differently sized openings vary in a manner to at least partially compensate for stresses on the die due to the asymmetric distribution of the plurality of differently sized openings.

8. The integrated circuit die of claim 1, wherein the upper surface of the integrated circuit die has a first side, a second side opposite the first side, a third side, and a fourth side opposite the third side,
wherein the plurality of openings comprises differently sized openings along the first and second sides, a plurality of openings along the third side, and no openings along the fourth side.

9. The integrated circuit die of claim 8, wherein the openings on the first and second sides comprise at least three different sizes with the openings of the three different sizes having a smallest size positioned adjacent the third side and the openings of the three different sizes having a largest size positioned adjacent the fourth side.

10. The integrated circuit die of claim 1, wherein the openings comprise square openings in the top down view.

11. A packaged chip comprising:
a semiconductor die; and
a packaging substrate electrically connected to the die,
wherein the die includes a die passivation layer at an upper surface of the die, the die passivation layer having a plurality of differently sized openings exposing a corresponding plurality of bond pads and the die is electrically connected to the packaging substrate through the differently sized openings, wherein sizes of the differently sized openings are measured horizontally at an upper surface of the die passivation layer.

12. The packaged chip of claim 11, the semiconductor die further comprising a plurality of asymmetrically distributed bond pads, wherein the plurality of differently sized openings expose a corresponding plurality of the bond pads.

13. The packaged chip of claim 11, wherein the plurality of different sized openings comprises two or more groups of openings, each group having a different average opening size.

14. The packaged chip of claim 13, wherein the groups of openings correspond to two zones of the die, including a first zone comprising a first half of the die and a second zone comprising a second half of the die, wherein the first zone has a different average opening size compared to the second zone.

15. A method of packaging an integrated circuit die, the method comprising:
- providing a die having a plurality of bond pads;
- forming a passivation layer comprising polymer on the die; and
- creating a plurality of differently sized openings in the passivation layer to expose a corresponding plurality of the bond pads, positions of the differently sized openings distributed asymmetrically relative to an entire upper surface of the integrated circuit die in a top down view, wherein sizes of the differently sized openings are measured horizontally at an upper surface of the die passivation layer.

16. The method of claim 15, wherein the passivation layer comprises polyimide.

17. The method of claim 15, wherein the passivation layer further comprises an inorganic dielectric layer.

18. The method of claim 15, wherein the plurality of differently sized openings comprises a plurality of groups of openings, each group having a different average opening size.

19. The method of claim 18, further comprising positioning the plurality of differently sized openings such that a first group has a first average opening size and is positioned in a first zone of the upper surface of the integrated circuit die in a top down view having a first areal density of bond pads, and a second group having a second average opening size and is positioned in a second zone of the upper surface of the integrated circuit die in a top down view having a second areal density of bond pads, wherein the first average opening size is smaller than the second average opening size, and the first areal density of bond pads is greater than the second areal density of bond pads.

20. The method of claim 15, further comprising flip chip attaching the die to a packaging substrate.

21. The method of claim 15, further comprising varying sizes of the plurality of the differently sized openings in a manner to at least partially compensate for stresses on the die due to the asymmetric distribution of the plurality of differently sized openings.

22. The packaged chip of claim 11, wherein the packaging substrate is electrically connected to the die via thermocompression bonding, and wherein the plurality of differently sized openings is configured to reduce stress gradients in the die from the thermocompression bonding relative to openings having a uniform size.

23. The method of claim 15, further comprising thermocompression bonding the die to a packaging substrate through the differently sized openings.

24. The method of claim 15, further comprising positioning the plurality of differently sized openings to reduce stress gradients in the die relative to uniform opening sizes.

* * * * *

UNITED STATES PATENT AND TRADEMARK OFFICE
CERTIFICATE OF CORRECTION

| | |
|---|---|
| PATENT NO. | : 10,074,624 B2 |
| APPLICATION NO. | : 14/821228 |
| DATED | : September 11, 2018 |
| INVENTOR(S) | : Vikram Venkatadri |

It is certified that error appears in the above-identified patent and that said Letters Patent is hereby corrected as shown below:

On the Title Page

Item (73) Assignee, Line 1, change "IA" to --MA--.

In the Specification

Column 5, Line 1, change "1500 µM$^2$," to --1500 µm$^2$,--.

Signed and Sealed this
Twenty-third Day of April, 2019

Andrei Iancu
*Director of the United States Patent and Trademark Office*